(12) United States Patent
Tachikawa et al.

(10) Patent No.: US 7,208,043 B2
(45) Date of Patent: Apr. 24, 2007

(54) SILICON SEMICONDUCTOR SUBSTRATE AND PREPARATION THEREOF

(75) Inventors: Akiyoshi Tachikawa, Yamaguchi (JP); Atsushi Ikari, Yamaguchi (JP)

(73) Assignee: Siltronic AG, Munich (DE)

( * ) Notice: Subject to any disclaimer, the term of this patent is extended or adjusted under 35 U.S.C. 154(b) by 716 days.

(21) Appl. No.: 10/236,273

(22) Filed: Sep. 6, 2002

(65) Prior Publication Data

US 2003/0056715 A1 Mar. 27, 2003

(30) Foreign Application Priority Data

Sep. 14, 2001 (JP) .............................. 2001-280459

(51) Int. Cl.
*C30B 21/06* (2006.01)

(52) U.S. Cl. ............... 117/20; 117/2; 117/13; 117/19; 428/641

(58) Field of Classification Search .............. 117/2, 117/13, 20, 19; 428/641
See application file for complete search history.

(56) References Cited

U.S. PATENT DOCUMENTS

| | | | |
|---|---|---|---|
| 5,438,951 A * | 8/1995 | Tachikawa et al. ........... 117/84 |
| 5,502,010 A | 3/1996 | Nadahara et al. |
| 5,683,504 A * | 11/1997 | Izunome et al. ............. 117/13 |
| 5,700,320 A * | 12/1997 | Izunome et al. ............. 117/19 |
| 5,704,974 A * | 1/1998 | Izunome et al. ............. 117/28 |
| 5,833,749 A * | 11/1998 | Moritani et al. ............ 117/101 |
| 5,919,302 A * | 7/1999 | Falster et al. ................. 117/3 |
| 5,935,320 A | 8/1999 | Graef et al. |
| 6,080,237 A * | 6/2000 | Iwasaki et al. .............. 117/13 |
| 6,191,009 B1 * | 2/2001 | Tamatsuka et al. ......... 438/471 |
| 6,228,164 B1 * | 5/2001 | Ammon et al. .............. 117/19 |
| 6,254,672 B1 * | 7/2001 | Falster et al. ................ 117/13 |
| 6,284,039 B1 * | 9/2001 | Mule'Stagno et al. ......... 117/3 |
| 6,395,653 B1 * | 5/2002 | Obermeier et al. ......... 438/795 |
| 6,485,807 B1 * | 11/2002 | Park .......................... 428/64.1 |
| 6,492,682 B1 * | 12/2002 | Akiyama et al. ........... 257/347 |
| 6,548,035 B1 * | 4/2003 | Kimura et al. ........... 423/328.2 |
| 6,548,886 B1 * | 4/2003 | Ikari et al. ................... 257/610 |
| 6,599,603 B1 * | 7/2003 | Kato et al. ................. 428/64.1 |
| 6,617,034 B1 * | 9/2003 | Hamaguchi et al. ........ 428/446 |
| 6,767,848 B2 * | 7/2004 | Tachikawa et al. ......... 438/775 |
| 6,805,742 B2 * | 10/2004 | Tachikawa et al. ........... 117/30 |

FOREIGN PATENT DOCUMENTS

| | | |
|---|---|---|
| DE | 4323964 | 1/1994 |
| EP | 0 829 559 | 3/1998 |
| EP | 0 909 840 | 4/1999 |
| EP | 0 942 078 | 9/1999 |
| EP | 0 962 557 | 12/1999 |
| EP | 1 035 235 | 9/2000 |

OTHER PUBLICATIONS

Wolf et al., Silicon Processing for the VLSI Era, vol. 1: Processing Technology, Lattice Press, Sunset Beach, CA, USA, pp. 1-72, 1986.*
Patent Abstract of Japan corresponding to JP 06-252154.
Patent Abstract of Japan corresponding to JP 2000-211995.
Patent of Abstract of Japan corresponding to JP 06-252154.

* cited by examiner

*Primary Examiner*—Yogendra Gupta
*Assistant Examiner*—G. Nagesh Rao
(74) *Attorney, Agent, or Firm*—Brooks Kushman P.C.

(57) ABSTRACT

A silicon semiconductor substrate has a structure possessing oxygen precipitate defects fated to form gettering sites in a high density directly below the defect-free region of void type crystals. The silicon semiconductor substrate is formed by heat-treating a silicon semiconductor substrate derived from a silicon single crystal grown by the Czochralski method or the magnetic field-applied Czochralski method and characterized by satisfying the relational expression (Oi DZ)−(COP DZ)≦10 μm wherein Oi DZ denotes a defect-free zone of oxygen precipitate crystal defects and COP DZ denotes a region devoid of a void type defect measuring not less than 0.11 μm in size, and having not less than $5 \times 10^8$ oxygen precipitate crystal defects per $cm^3$. The method for making the substrate comprises the steps of deriving a silicon semiconductor substrate from a silicon single crystal grown by the Czochralski method or the magnetic field-applied Czochralski method using molten silicon containing not less than $5 \times 10^{17}$ atoms and not more than $1.5 \times 10^{19}$ atoms of nitrogen per $cm^3$ and heat-treating the silicon semiconductor substrate in a non-oxidizing atmosphere at a highest final temperature of not lower than 1150° C. for not less than one hour.

6 Claims, No Drawings

SILICON SEMICONDUCTOR SUBSTRATE AND PREPARATION THEREOF

BACKGROUND OF THE INVENTION

1. Field of the Invention

This invention relates to a silicon semiconductor substrate and a method for the production thereof. More particularly, the invention relates to a silicon semiconductor substrate of a void type product possessing a high gettering layer directly below a defect free zone thereof, and a method for the production thereof.

2. The Prior Art

For improving the gettering effect of a semiconductor substrate, a silicon wafer cut out of a silicon single crystal formed by pulling from a silicon melt according to the Czochralski method has been known from Japanese Patent No. JP-A-06-252,154. This document describes a silicon wafer having the following characteristics: The surface layer part of the mirror face thereof has an interstitial oxygen concentration of not more than $2 \times 10^{17}$ atoms/cm$^3$; the thickness thereof over a depth of not less than 10 µm from the surface of the mirror face forms a defect free zone; the defect free zone contains such minute defects as oxygen precipitates at a density of not more than $10^5$ pieces/cm$^3$; the region thereof deeper than the defect free zone is possessed of an internal gettering layer having minute defects formed therein at a density of not less than $10^8$ pieces/cm$^3$; and the rear side of the mirror face thereof is not possessed of an external gettering layer.

Regarding both the improvement in the defect-free zone of a void type defect and the improvement in the gettering effect, a silicon single crystal wafer obtained by slicing a silicon single crystal ingot grown by being doped with nitrogen according to the Czochralski method has been shown in Japanese Patent No. JP-A-2000-211995. This patent refers to a silicon single crystal wafer having the following characteristics: The silicon single crystal wafer has a defect-free zone (hereinafter called a "denuded zone", DZ) with a depth in the range of 2–12 µm after the gettering heat treatment or after the heat treatment performed for the production of a device and has internal minute defects at a density in the range of $1 \times 10^8$–$2 \times 10^{10}$ pieces/cm$^3$.

The former invention suggests nothing about the addition of nitrogen and discloses absolutely nothing about the denuded zone of a void type defect. The latter invention suggests nothing about the optimization of the nitrogen concentration and the cooling rate of the silicon single crystal being pulled at a temperature range of 1100° C. (hereinafter referred to simply as "cooling rate") to be attained by controlling both the void type crystal defects and the depth of the oxygen precipitate type defect from the surface.

Specifically, the prior art attains an addition to the depth of the defect-free zone of void type crystal defects by elongating the duration of an annealing operation or heightening the annealing temperature. This approach, however, is at a disadvantage in promoting the external diffusion of oxygen, further increasing the width of the defect-free zone of an oxygen precipitate, and dissolving the oxygen precipitate and consequently weakening the gettering effect.

SUMMARY OF THE INVENTION

The objects mentioned above are accomplished by the following items (1)–(6):

(1) A silicon semiconductor substrate formed by heat-treating a silicon semiconductor substrate derived from a silicon single crystal grown by the Czochralski method or the magnetic field-applied Czochralski method and characterized by satisfying the relational expression, $$(Oi\ DZ) - (COP\ DZ) \leq 10\ \mu m \tag{1}$$

wherein Oi DZ denotes the thickness of a zone which is free of oxygen precipitates and COP DZ denotes the thickness of a zone devoid of void type defects measuring not less than 0.11 µm in size, and having not less than $5 \times 10^8$ oxygen precipitate crystal defects per cm$^3$.

(2) A method for the production of a silicon semiconductor substrate set forth in item (1) above, wherein the substrate possesses at a depth of not less than 5 µm from the surface thereof a locally concentrated part originating in a nitrogen segregation exhibiting a signal strength not less than twice as high as the average signal strength as determined in the analysis of nitrogen by the method of secondary ion mass analysis (SIMS).

(3) A method for the production of a silicon semiconductor substrate according to item (1) above, characterized by heat-treating a silicon semiconductor substrate having a nitrogen concentration of not less than $5 \times 10^{14}$ atoms/cm$^3$ and not more than $1 \times 10^{16}$ atoms/cm$^3$ in a non-oxidizing atmosphere. After heat-treatment, the semiconductor substrate subsequently has an oxygen concentration of not more than $7 \times 10^{16}$ atoms/cm$^3$ at a depth of 1 µm from the surface at the center of the substrate and possesses a locally concentrated part originating in a nitrogen segregation exhibiting a signal strength not less than twice as high as the average signal strength as determined in the analysis of nitrogen by the method of secondary ion mass analysis (SIMS) at a depth of not less than 5 µm from the surface thereof.

(4) A method for the production of a silicon semiconductor substrate according to item (1) above, wherein a silicon semiconductor substrate is derived from a silicon single crystal grown by the Czochralski method or the magnetic field-applied Czochralski method using molten silicon containing not less than $5 \times 10^{17}$ atoms and not more than $1.5 \times 10^{19}$ atoms of nitrogen per cm$^3$ and heat-treating the silicon semiconductor substrate in a non-oxidizing atmosphere at a highest final temperature of not lower than 1150° C. for not less than one hour. The substrate is thereby enabled to acquire an oxygen concentration of not more than $7 \times 10^{16}$ atoms/cm$^3$ at a depth of 1 µm from the surface at the center of the substrate and to possess a locally concentrated part owing to a nitrogen segregation exhibiting signal strength not less than twice as high as the average signal strength as determined by the analysis of nitrogen according to the method of secondary ion mass analysis (SIMS) at a depth of not less than 5 µm from the surface thereof.

(5) A method for the production of a silicon semiconductor substrate according to item (1) above, characterized by pulling a silicon single crystal from a silicon melt containing not less than $5 \times 10^{17}$ atoms and not more than $1.5 \times 10^{19}$ atoms of nitrogen per cm$^3$ according to the Czochralski method or the magnetic field-applied Czochralski method, growing the ascending silicon single crystal at a cooling rate of not less than 5° C./min, obtaining a silicon semiconductor substrate at such a cooling speed and such a nitrogen concentration as satisfy the relational expression, $$8620000 \times (CR)^{-1.4} \times \mathrm{EXP}(-3.3 \times 10^{-15} \times [N]) \leq 100000\ \mathrm{nm}^3 \tag{2}$$

which indicates the maximum void volume where [N] (atoms/cm$^3$) represents the nitrogen concentration in the silicon substrate prior to the heat treatment and CR (° C./min) represents the cooling rate at 1100° C. during the growth of the silicon single crystal, and heat-treating the silicon semiconductor substrate in a non-oxidizing atmosphere at a highest final temperature of not lower than 1150° C. for not less than one hour.

(6) A method for the production of a silicon semiconductor substrate according to item (1) above, characterized by pulling a silicon single crystal from a silicon melt containing not less than $1\times10^{18}$ atoms and not more than $1.5\times10^{19}$ atoms of nitrogen per cm$^3$ according to the Czochralski method or the magnetic field-applied Czochralski method, growing the ascending silicon single crystal at a cooling rate of not less than 1° C./min and less than 5° C./min at 1100° C., obtaining a silicon semiconductor substrate at such a cooling rate and such a nitrogen concentration as satisfy the relational expression:

$$8620000\times(CR)^{-1.4}\times\text{EXP}(-3.3\times10^{-15}\times[N])\leq 150000\text{nm}^3 \quad (3)$$

which indicates the maximum void volume where [N] (atoms/cm$^3$) represents the nitrogen concentration in the silicon substrate prior to the heat treatment and CR (° C./min) represents the cooling rate at 1100° C. during the growth of the silicon single crystal, and heat-treating the silicon semiconductor substrate in a non-oxidizing atmosphere at a highest final temperature of not lower than 1200° C. for not less than one hour.

DETAILED DESCRIPTION OF THE INVENTION

The silicon semiconductor substrate according to this invention is obtained by slicing in a prescribed thickness an ingot of silicon single crystal grown by the Czochralski method (hereinafter referred to as "CZ method") or the magnetic field-applied Czochralski method (hereinafter referred to as "magnetic field-applied CZ method").

To be specific, the CZ method comprises such steps as bringing a seed crystal into contact with the melt of a polycrystalline silicon raw material accommodated in a quartz crucible and slowly pulling the seed crystal while rotating it, meanwhile thereby growing a silicon single crystal of a prescribed diameter. The crystal, while being pulled, can be doped in the interior thereof with nitrogen by having a nitride placed in advance in the quartz crucible, by injecting a nitride into the molten silicon, or by causing the atmospheric gas in the quartz crucible to contain nitrogen. In this case, the amount of the dope incorporated in the crystal can be controlled by adjusting the amount of the nitride, the concentration of the nitrogen gas, or the duration of the introduction. The procedure of the magnetic field-applied CZ method is identical with that of the CZ method except that the application of a magnetic field to the interior of the quartz crucible is continued during the course of this procedure. Thus, the control of the nitrogen concentration in the range of $5\times10^{14}$–$1\times10^{16}$ atoms/cm$^3$ in the case of a silicon semiconductor substrate or in the range of $5\times10^{17}$–$1.5\times10^{19}$ atoms/cm$^3$ in the case of molten silicon during the course of a pulling operation can be easily carried out.

Further, it is preferable, while growing the silicon single crystal ingot doped with nitrogen according to the CZ method or the magnetic field-applied CZ method, to control concentration of the oxygen contained in the single crystal ingot in the range of $6.5\times10^{17}$–$1\times10^{18}$ atoms/cm$^3$. The decrease of the oxygen concentration to a level within the range mentioned above during the growth of the silicon single crystal ingot may be effected by any of the methods heretofore in popular use. The oxygen concentration can be easily confined within the range mentioned above by such means as decreasing the rotational frequency of the crucible, increasing the flow rate of the gas to be introduced, lowering the atmospheric pressure, and adjusting the temperature distribution of the molten silicon and the convection thereof, for example.

While growing the silicon single crystal ingot doped with nitrogen according to the CZ method or the magnetic field-applied CZ method, it is preferable to keep the cooling rate of the growing crystal during the passage thereof through-the temperature region of 1100° C. in the range of 1–15° C. These conditions can be attained, for example, by a method of increasing or decreasing the speed of the growth of the crystal by adjusting the speed of pulling the crystal. It may be otherwise attained by having a device capable of cooling the crystal at an arbitrary cooling speed installed within the chamber of the device for the production of a silicon single crystal by the CZ method or the magnetic field-applied CZ method. For the sake of this cooling, a device which is capable of cooling a given crystal by blowing a cooling gas against the crystal or a method of disposing a water-cooled ring at a fixed position on the surface of the melt so as to enclose the crystal may be utilized. In this case, the cooling speed can be confined within the range mentioned above by adjusting the cooling method mentioned above and the speed of pulling the crystal.

By performing the CZ method or the magnetic field-applied CZ method as described above, it is possible to obtain a silicon single crystal ingot which is doped with nitrogen in an expected concentration, made to contain oxygen in an expected concentration, and enabled to attain growth of crystal at an expected cooling speed. This silicon single crystal ingot, according to the ordinary method, is sliced with a cutting device such as an internally peripheral slicer or a wire saw and then worked into a silicon single crystal wafer by a series of steps such as chamfering, lapping, etching, and grinding. Naturally, these steps are adduced herein purely for the sake of illustration. The adoption of various other steps such as washing is conceivable. The process of these steps may be properly modified as by altering the sequence of the component steps or omitting part of the component steps so as to suit the purpose for which the product is used.

Then, by subjecting the silicon single crystal wafer obtained as described above to a heat treatment such as the subsequent gettering heat treatment and/or the device production heat treatment, it is possible to obtain a silicon semiconductor substrate which satisfies the relational expression (Oi DZ)–(COP DZ)$\leq$10 μm, and containing oxygen precipitates at a density exceeding $5\times10^{18}$ pieces/cm$^3$, preferably falling in the range of $1\times10^9$–$1\times10^{10}$ pieces/cm$^3$. Incidentally, the value of Oi DZ (denuded zone of oxygen precipitates) mentioned herein indicates the depth of the precipitate-free zone (DZ) which is the result of the measurement with a BMD analyzer (MO4). The measurement is performed by passing a sample through the filter (10% cutting the signal intensity, named "ND filter") to determine the depth at which the density is 30% of the density of oxygen precipitates at the bulk part of the sample and report this depth as signifying the denuded zone of the oxygen precipitates (Oi DZ).

This invention defines the upper limit of the maximum void volume of the silicon semiconductor substrate prior to the heat treatment in the relational expressions (2) and (3), referred to in numbered paragraphs 5 and 6, above. In the working examples, the void volumes were calculated also from the maximum signal strengths of OPP (infrared interference method). Since the actual determination of the void volume by TEM is difficult from the standpoint of cost and time, we have clarified the relation between the maximum void volume and the OPP maximum signal strength found by the TEM observation in the wafers under evaluation with a view to permitting future confirmation of whether the void volume found by the calculation actually agrees with the prescribed void volume. It has been confirmed by the measurement of the void volume through the TEM observation and the correspondence of the OPP maximum signal strength that the formula for calculating the void volume from the OPP maximum signal strength varies when the cooling rate is not less than 1° C./min and less than 3° C./min, when it is not less than 3° C./min and less than 5° C./min, and when it is not less than 5° C./min, and the formula for calculating the void volume based on the nitrogen concentration varies as follows. As a result, it has been found that when the cooling rate is not less than 5° C./min and the nitrogen concentration of the silicon semiconductor substrate prior to the heat treatment is less than $5 \times 10^{14}$ atoms/cm$^3$ or when the cooling rate is not less than 1° C./min and less than 3° C./min and the nitrogen concentration is less than $2 \times 10^{14}$ atoms/cm$^3$, the void volume is given by the following expression:

$$\text{Void volume(nm}^3\text{)}=110000\times(\text{OPP maximum signal strength})^{1.1} \quad (4)$$

When the cooling rate is not less than 5° C./min and the nitrogen concentration in the silicon semiconductor substrate prior to the heat treatment is not less than $5 \times 10^{14}$ and not more than $1 \times 10^{16}$ atoms/cm$^3$, when the cooling rate is not less than 3° C./min and less than 5° C./min and the nitrogen concentration in the silicon semiconductor substrate prior to the heat treatment is not less than $2 \times 10^{14}$ and less than $2 \times 10^{15}$ atoms/cm$^3$, or when the cooling rate is not less than 1° C./min and less than 3° C./min and the nitrogen concentration in the silicon semiconductor substrate prior to the heat treatment is not less than $2 \times 10^{14}$ and less than $1 \times 10^{15}$ atoms/cm$^3$, the void volume is given by the following expression:

$$\text{Void volume(nm}^3\text{)}=20000\times(\text{OPP maximum signal strength})^{1.6} \quad (5)$$

When the cooling rate is not less than 1° C./min and less than 3° C./min and the nitrogen concentration in the silicon wafer prior to the heat treatment is not less than $1 \times 10^{15}$ atoms/cm$^3$ or when the cooling rate is not less than 3° C./min and less than 5° C./min and the nitrogen concentration in the silicon semiconductor substrate prior to the heat treatment is not less than $2 \times 10^{15}$ and not more than $1 \times 10^{16}$ atoms/cm$^3$, the void volume is given by the following expression:

$$\text{Void volume(nm}^3\text{)}=110\times(\text{OPP maximum signal strength})^{3.6} \quad (6)$$

By using this relational expression, it is possible to find the maximum size of the void type defect in the silicon semiconductor substrate involving the addition of nitrogen and to confirm that the produced silicon semiconductor substrate prior to the heat treatment is controlled to the size of the void type defect defined by this invention.

In the working examples, the maximum void volumes in the wafers under test calculated from the OPP maximum signal strengths were nearly equal to those calculated by applying the cooling rate and the nitrogen concentrations reported in the working examples to the expressions (2) and (3) and their numerical values were found to be not more than 100000 nm$^3$ and 150000 nm$^3$ defined respectively by equations (2) and (3). In the comparative examples, the maximum void volumes were found to be larger than the void volumes of the foregoing numerical values. It has been demonstrated by the working examples and the comparative examples that the production of a silicon semiconductor substrate fulfilling the expression (1) requires the cooling speed and the nitrogen concentration to fall in the scope of this invention.

Further, in the silicon semiconductor substrate according to this invention, the segregated nitrogen forms oxygen precipitate defects so minute as to defy measurement by the BMD analyzer. To secure the denuded zone of the surface infallibly, therefore, the substrate is preferred to possess at a depth of not less than 5 μm from the surface a locally concentrated part owing to a nitrogen segregation exhibiting signal strength not less than twice as high as the average signal strength as determined by the analysis of nitrogen according to the method of secondary ion mass analysis (SIMS).

The silicon semiconductor substrate according to this invention is further preferred to have a nitrogen concentration in the range of $5 \times 10^{14}$ atoms/cm$^3$–$1 \times 10^{16}$ atoms/cm$^3$. After the silicon semiconductor substrate is heat-treated in a non-oxidizing atmosphere such as in the atmosphere of one gas or a mixture of two or more gases selected from among hydrogen, nitrogen, argon, and helium, the silicon semiconductor substrate acquires an oxygen concentration of not more than $7 \times 10^{16}$ atoms/cm$^3$ at a depth of 1 μm from the surface at the center of the substrate and, for the reason given above, possesses at a depth of not less than 5 μm from the surface a locally concentrated part owing to a nitrogen segregation exhibiting signal strength not less than twice as high as the average signal strength as determined by the analysis of nitrogen according to the method of secondary ion mass analysis (SIMS). The upper limit of the nitrogen concentration is set at $1 \times 10^{16}$ atoms/cm$^{16}$ herein in order to avoid the possibility that the silicon single crystal ingot in the process of being pulled will be forced to assume a polycrystalline texture when the nitrogen concentration exceeds $1 \times 10^{16}$ atoms/cm$^{16}$.

Thus, this invention is characterized by the capability of forming oxygen precipitates destined to form a gettering site directly below the denuded zone of void type crystal defects which is an active layer for a device by continuing the control of the depth of the region. The invention is further characterized by the capability of effecting the control so as to satisfy the following expressions:

$$\text{BMD density}\geq 5\times 10^{8}/\text{cm}^3 \text{ and } (Oi\ DZ)-(COP\ DZ)\leq 10\ \mu\text{m} \quad (7)$$

The silicon semiconductor substrate which possesses such solid state properties as mentioned above is preferably produced by obtaining a silicon semiconductor substrate from a silicon single crystal grown by the CZ method or the magnetic field-applied CZ method using molten silicon containing nitrogen at a concentration in the range of $5 \times 10^{17}$–$1.5 \times 10^{19}$ atoms/cm$^3$ in the case of the cooling rate of silicon ingot pulling being more than 5° C./min or using molten silicon containing nitrogen at a concentration in the range of $1 \times 10^{18}$–$1.5 \times 10^{19}$ atoms/cm in the case of the cooling rate being not less than 1° C./min and less than 5° C./min and heat-treating the silicon semiconductor substrate in the non-oxidizing atmosphere mentioned above at a highest final temperature exceeding 1150° C. and preferably falling in the range of 1200° C.–1250° C. for not less than one hour.

For the purpose of more infallibly realizing the silicon semiconductor substrate contemplated by this invention, a silicon semiconductor substrate which is derived from a silicon single crystal which has been pulled from a silicon melt containing $5 \times 10^{17}$ atoms–$1.5 \times 10^{19}$ atoms of nitrogen per cm$^3$ and, when the silicon single crystal being pulled passes a temperature region of 1100° C., cooled at a speed exceeding 5° C./min, preferably falling in the range of 5–15° C./min to the silicon semiconductor substrate at such a cooling rate and such a nitrogen concentration as satisfy the relational expression (2) for the maximum void volume is heat-treated in a non-oxidizing atmosphere at a highest final temperature exceeding 1150° C. for not less than one hour, and preferably at a temperature in the range of 1200–1250° C. for not less than 0.5 hour, and preferably for a duration in the range of 1–2 hours.

When the cooling rate is lowered less than 5° C./min, the void type defects become larger in size. A large amount of nitrogen is required to contract the voids. Further, to diffuse by a heat treatment the inner wall oxide film having a larger thickness than when the cooling rate is low, the temperature of the heat treatment is preferred to be as high as possible. For the purpose of efficiently and infallibly obtaining the silicon semiconductor substrate according to the invention, therefore, a silicon semiconductor substrate derived from a silicon single crystal which has been pulled from a silicon melt containing $1 \times 10^{18}$ atoms–$1.5 \times 10^{19}$ atoms of nitrogen per cm$^3$ and, when the silicon single crystal being pulled passes a temperature region of 1100° C., cooled at a speed exceeding 1° C./min and falling short of 5° C./min, preferably falling in the range of 3–5° C./min, to obtain the silicon semiconductor substrate at such a cooling speed and such a nitrogen concentration as satisfy the relational expression (3) for the maximum void volume, is heat-treated in a non-oxidizing atmosphere at a highest final temperature exceeding 1200° C., preferably falling in the range of 1200–1250° C. for not less than one hour, preferably for a duration in the range of 1–2 hours.

The silicon semiconductor substrate manufactured by the method of production according to this invention secures a COP DZ of a thickness of not less than 5 μm, excels in the capacity for gettering impurities, and satisfies the relational expression (1) when the oxygen concentration at a depth of 1 μm from the surface at the center of the wafer thereof is not more than $7 \times 10^{16}$ atoms/cm$^3$.

EXAMPLES

Now, this invention will be described more specifically below with reference to examples and comparative examples adduced herein for illustration. It should be noted, however, that this invention is not limited to these examples.

From a polycrystalline silicon charged as a raw material in an 18-inch quartz crucible for pulling a crystal ingot 6 inches in diameter and a 22-inch quartz crucible for pulling a crystal ingot 8 inches in diameter according to the CZ method, P type silicon single crystal ingots measuring 6 inches and 8 inches in diameter, having an orientation of <100>, and manifesting resistivity In the range of 8.5–11.5 Ωcm were prepared under varied conditions of nitrogen concentration, oxygen concentration, average SL (in mm/min; SL means the speed of ingot pulling), and cooling rate.

The amount of nitrogen used for doping was controlled by causing the raw material to contain in advance a prescribed amount of silicon wafers furnished with a silicon nitride film. The oxygen concentration was controlled by regulating the rotation of the crucible during the course of an operation of pulling the silicon single crystal from a silicon melt. The cooling rate was controlled by varying the speed of pulling the single crystal ingot and varying the speed of growth of the crystal. The produced silicon single crystal ingot was tested for properties. The results of the test were as shown in Table 1.

TABLE 1

| Ingot (IG) | Concentration of nitrogen in molten silicon (atoms/cm$^3$) | Cooling rate at 1100° C. (° C./min) | Concentration of oxygen before heat-treating (atoms/cm$^3$) | Average SL (mm/min) | Diameter of wafer (inches) |
|---|---|---|---|---|---|
| A | $5 \times 10^{17}$ | 11 | $8.5\sim9.5 \times 10^{17}$ | 2.2 | 6 |
| B | $5 \times 10^{17}$ | 11 | $7.5\sim8.5 \times 10^{17}$ | 2.2 | 6 |
| C | $5 \times 10^{17}$ | 7 | $8.5\sim9.5 \times 10^{17}$ | 1.6 | 6 |
| D | $5 \times 10^{17}$ | 7 | $8.5\sim9.5 \times 10^{17}$ | 1.6 | 6 |
| E | $1.5 \times 10^{18}$ | 11 | $8.0\sim9.0 \times 10^{17}$ | 2.2 | 6 |
| F | $1.5 \times 10^{18}$ | 7 | $8.0\sim9.0 \times 10^{17}$ | 1.6 | 6 |
| G | 0 | 11 | $8.5\sim9.5 \times 10^{17}$ | 2.2 | 6 |
| H | 0 | 7 | $8.5\sim9.5 \times 10^{17}$ | 1.6 | 6 |
| I | $1.2 \times 10^{17}$ | 11 | $8.0\sim9.0 \times 10^{17}$ | 2.2 | 6 |
| J | $1.2 \times 10^{17}$ | 2.5 | $7.0\sim8.0 \times 10^{17}$ | 1.6 | 6 |
| K | $1.0 \times 10^{18}$ | 4.5 | $7.5\sim8.5 \times 10^{17}$ | 1.4 | 8 |
| L | $1.0 \times 10^{18}$ | 2.5 | $7.0\sim8.0 \times 10^{17}$ | 1.1 | 8 |
| M | 0 | 4.5 | $8.5\sim9.5 \times 10^{17}$ | 1.4 | 8 |
| N | 0 | 2.5 | $8.5\sim9.5 \times 10^{17}$ | 1.1 | 8 |
| O | $5 \times 10^{17}$ | 4.5 | $7.5\sim8.5 \times 10^{17}$ | 1.4 | 8 |
| P | $5 \times 10^{17}$ | 2.5 | $7.0\sim8.0 \times 10^{17}$ | 1.1 | 8 |

Wafers were sliced with a wire saw from the single crystal ingots obtained as described above and subjected to such works as chamfering, lapping, etching, and mirror grinding performed under nearly the same conditions except the amount of nitrogen for doping, the concentration of oxygen, and the cooling rate to prepare a plurality of silicon single crystal mirror face wafers in a varying lot.

The silicon single crystal wafers obtained as described above were given a gettering heat treatment. The gettering heat treatment in this case was effected by heating a given silicon single crystal wafer in an atmosphere formed of 20 vol % of hydrogen and 80 vol % of argon at a temperature increasing rate of 8° C./min in the temperature range of 800–1000° at a temperature increasing rate of 4° C./min in the temperature range of 1000–1100° C., at a temperature increasing rate of 1° C./min in the temperature range of 1100–1150° C., and at a temperature increasing rate of 1° C./min in the temperature range of 1150–1200° C. and allowing it to stand for four hours to eight hours when the maximum final temperature is 1150° C. or for 30 minutes to two hours when this temperature is 1200° C. After the standing, the wafer was cooled sequentially at a temperature decreasing rate of 1° C./min in the temperature range of 1200–1150° C., at a temperature decreasing rate of 1° C./min in the temperature range of 1150–1100° C., and at a temperature decreasing rate of 4° C./min in the temperature range of 1100–800° C. The effect of the non-oxidizing atmosphere used in this heat treatment remained intact even when the ratio of the amounts of argon and hydrogen in vol % varied as in an extreme case of using argon in an amount of 100 vol % or hydrogen in an amount of 100 vol %.

Subsequently, the silicon single crystal wafers thus obtained were evaluated as to the depth of a fault-free layer. For the sake of this evaluation of the depth of the denuded zone, the wafers were first required to have their surfaces reground so as to allow preparation of wafers having surface layers thereof removed in varying amounts. Then the wafers were washed in a SC-1 liquid mixture (liquid mixture composed of aqua ammonia ($NH_4OH$), aqueous hydrogen peroxide solution ($H_2O_2$), and extremely pure water at a ratio of 1:1:20) at a temperature of about 80° C. for one hour to visualize minute COPs. The depth in question was evaluated by examining a given wafer surface under an SPI particle tester made by KLA/Tencor Corp and taking count of COPs on the surface. The COP volume density was determined by performing the washing with the SC-1 liquid mixture up to ten repetitions, finding the increase in the number of COPs by deducting the number found before the washing from the number found after the ten times of washing, and dividing this increase by the volume removed by the etching with the SC-1 liquid mixture. The removal of the surface layer by the regrinding was effected to a varying depth of 1, 3, 5, 7, or 12 μm.

The depth of the denuded zone of critical defect was additionally determined by causing a given wafer which had the surface layer thereof removed in a varying amount by regrinding in the same manner as described above to be evaluated as to the quality of gate oxide integrity (GOI). The quality of gate oxide integrity was evaluated by determining the C mode yield of time zero dielectric breakdown (TZDB), and more specifically by preparing a phosphorus-doped polysilicon electrode (having an oxide film thickness of 25 nm and an electrode surface area of 20 mm2), rating as a conforming article a sample showing a dielectric breakdown electric field of not less than 11 MV/cm in a test with a control current of 100 $mA/cm^2$, and finding an efficiency percentage for all the electrodes existing within the surface of the tested wafer.

With a view to studying the density of oxygen precipitate crystal defects and the Oi DZ, the silicon single crystal wafer, i.e. the product of this invention, was given a heat treatment resembling the heat treatment intended for devices. This heat treatment was effected by subjecting a given silicon single crystal wafer in an atmosphere of nitrogen gas to a heat treatment at 800° C. for four hours and subsequently to an oxidizing heat treatment at 1000° C. for 16 hours.

The inventors investigated the depth of locally concentrated part owing to a nitrogen segregation exhibiting signal strength not less than twice as high as the average signal strength as determined by the analysis of nitrogen according to the method of secondary ion mass analysis (SIMS). The depth of these locally concentrated parts are denoted the depth of N spike in the tables.

The silicon single crystal wafer which had been pulled and mirror ground and had not yet been given a heat treatment was examined to select from the internal minute defects occurring therein those of the largest signal strength and measure them for sizes. The determination of the density of internal minute defects was carried out by the optical precipitate profiler (OPP) method. This OPP method utilizes the principle of the Normalski type differential interference microscope. First, a laser beam emanating from a light source is separated with a polarizing prism into two perpendicularly intersecting linearly polarized beams including a phase difference of 90° and injecting these beams into a given wafer from the mirror face side. At this time, one of the beams, on intersecting a defect, produces a phase shift and gives rise to a phase difference from the other beam. This defect is detected by detecting the phase difference with a polarization analyzer after the beams have passed through the rear face of the wafer.

The results of the determination obtained as described above are shown in Table 2–Table 6 (wherein IG denotes the ingot type specified in Table 1). Regarding the evaluation of the depth of a denuded zone, the evaluation in terms of the number of COPs was carried out by repeating the washing with the SC-1 liquid mixture mentioned above. The depth satisfying the condition that the COP volume density in the wafer face be not more than $2 \times 10^5$ pieces/$cm^3$ and the efficiency percentage determined with the gate oxide integrity be not less than 90% was rated as indicating denuded zone of both void type defect and oxygen precipitates.

TABLE 2

| IG | [N] ($10^{11}$ atoms/$cm^3$) | [Oi] ($10^{17}$ atoms/$cm^3$) | Cooling Rate (° C./min) | OPP strength (V) | Calculated void volume ($nm^3$) | OPP calculated void volume ($nm^3$) | Annealing conditions (° C. × hr) | [Oi] at 1 mm depth ($10^{16}$ atoms/$cm^3$) | COP DZ (mm) | Oi DZ (mm) | Oi DZ-COP DZ (mm) | BMD density ($10^8$ pieces/$cm^3$) | Nitrogen Spike depth (mm) |
|---|---|---|---|---|---|---|---|---|---|---|---|---|---|
| A | 5.0 | 9.4 | 11 | 1.995 | 58000 | 60000 | 1150 × 4 | 3.5 | 10 | 17.3 | 7.3 | >1 × $10^9$ | 8 |
| A | 9.4 | 8.5 | 11 | 0.794 | 135000 | 14000 | 1150 × 4 | 3.2 | 10 | 17.3 | 7.3 | >1 × $10^9$ | 8 |
| A | 9.5 | 8.6 | 11 | 0.794 | 13000 | 14000 | 1150 × 2 | 4.5 | 7 | 13.4 | 5.4 | >1 × $10^9$ | 5 |
| A | 11 | 8.5 | 11 | 0.631 | 8000 | 9600 | 1200 × 0 | 6.4 | 7 | 11.3 | 6.3 | >1 × $10^9$ | 5 |
| A | 11 | 8.5 | 11 | 0.631 | 8000 | 9600 | 1200 × 1 | 4.5 | 12.5 | 19.8 | 7.3 | >1 × $10^9$ | 13.4 |
| B | 5.1 | 8.4 | 11 | 1.995 | 56000 | 60000 | 1150 × 4 | 3.2 | 10 | 17.3 | 7.3 | >1 × $10^9$ | 8 |
| B | 5.9 | 7.5 | 11 | 1.585 | 43000 | 42000 | 1150 × 4 | 2.8 | 10 | 17.3 | 7.3 | >1 × $10^9$ | 8 |
| B | 6.3 | 7.6 | 11 | 1.558 | 38000 | 42000 | 1150 × 2 | 4.0 | 7 | 13.4 | 5.4 | >1 × $10^9$ | 5 |
| B | 6.0 | 7.5 | 11 | 1.558 | 41000 | 42000 | 1200 × 0 | 5.6 | 7 | 13.4 | 5.4 | >1 × $10^9$ | 5 |
| B | 6.1 | 7.5 | 11 | 1.558 | 40000 | 42000 | 1200 × 1 | 4.0 | 12.5 | 19.8 | 7.3 | >1 × $10^9$ | 13.4 |
| C | 6.5 | 9.3 | 7 | 1.995 | 66000 | 60000 | 1150 × 4 | 3.4 | 10 | 17.3 | 7.3 | >1 × $10^9$ | 8 |
| C | 11.7 | 8.6 | 7 | 0.794 | 12000 | 14000 | 1150 × 4 | 3.2 | 10 | 17.3 | 7.3 | >1 × $10^9$ | 8 |
| C | 11.5 | 8.6 | 7 | 0.794 | 13000 | 14000 | 1150 × 2 | 4.5 | 7 | 13.4 | 5.4 | >1 × $10^9$ | 5 |
| C | 11.7 | 8.6 | 7 | 0.794 | 12000 | 14000 | 1200 × 0 | 6.4 | 7 | 11.3 | 6.3 | >1 × $10^9$ | 5 |
| C | 11.6 | 8.6 | 7 | 0.794 | 12300 | 14000 | 1200 × 1 | 4.5 | 12.5 | 19.8 | 7.3 | >1 × $10^9$ | 13.4 |
| D | 6.5 | 8.4 | 7 | 1.995 | 66000 | 60000 | 1150 × 4 | 3.0 | 10 | 7.3 | 7.3 | >1 × $10^9$ | 8 |

TABLE 3

| IG | [N] ($10^{11}$ atoms/$cm^3$) | [Oi] ($10^{17}$ atoms/$cm^3$) | Cooling Rate (° C./min) | OPP strength (V) | Calculated void volume ($nm^3$) | OPP calculated void volume ($nm^3$) | Annealing conditions (° C. × hr) | [Oi] at 1 μm depth ($10^{16}$ atoms/$cm^3$) | COP DZ (μm) | Oi DZ (μm) | Oi DZ-COP DZ (μm) | BMD density ($10^8$ pieces/$cm^3$) | Nitrogen Spike depth (μm) |
|---|---|---|---|---|---|---|---|---|---|---|---|---|---|
| D | 11.7 | 7.5 | 7 | 0.794 | 12000 | 14000 | 1150 × 4 | 2.8 | 10 | 17.3 | 7.3 | >1 × $10^9$ | 8 |
| D | 11.8 | 7.5 | 7 | 0.794 | 11500 | 14000 | 1150 × 2 | 3.9 | 7 | 13.4 | 5.4 | >1 × $10^9$ | 5 |
| D | 11.8 | 7.5 | 7 | 0.794 | 11500 | 14000 | 1200 × 0 | 5.6 | 7 | 11.3 | 6.3 | >1 × $10^9$ | 5 |
| D | 11.7 | 7.6 | 7 | 0.794 | 12000 | 14000 | 1200 × 1 | 4.0 | 12.5 | 19.8 | 7.3 | >1 × $10^9$ | 13.4 |
| E | 15.1 | 8.7 | 11 | 0.398 | 2000 | 4600 | 1150 × 4 | 3.2 | 10 | 17.3 | 7.3 | >1 × $10^9$ | 8 |
| E | 20 | 8.1 | 11 | 1.0 | 400 | 3200 | 1150 × 4 | 3.0 | 10 | 17.3 | 7.3 | >1 × $10^9$ | 8 |
| E | 19.9 | 8.1 | 11 | 1.0 | 400 | 3200 | 1150 × 2 | 4.2 | 7 | 13.4 | 5.4 | >1 × $10^9$ | 5 |
| E | 19.8 | 8.1 | 11 | 1.0 | 400 | 3200 | 1200 × 0 | 6.0 | 7 | 11.3 | 6.3 | >1 × $10^9$ | 5 |
| E | 19.8 | 8.1 | 11 | 1.0 | 400 | 3200 | 1200 × 1 | 4.2 | 12.5 | 19.8 | 7.3 | >1 × $10^9$ | 13.4 |
| F | 15.6 | 8.5 | 7 | 0.501 | 3300 | 6600 | 1150 × 4 | 3.1 | 10 | 17.3 | 7.3 | >1 × $10^9$ | 8 |
| F | 20 | 8.1 | 7 | 0.794 | 800 | 6600 | 1150 × 4 | 3.0 | 10 | 17.3 | 7.3 | >1 × $10^9$ | 8 |
| F | 19.9 | 8.1 | 7 | 0.794 | 800 | 4600 | 1150 × 2 | 4.2 | 7 | 13.4 | 5.4 | >1 × $10^9$ | 5 |
| F | 19.8 | 8.1 | 7 | 0.794 | 800 | 4600 | 1200 × 0 | 6.0 | 7 | 11.3 | 6.3 | >1 × $10^9$ | 5 |
| F | 19.8 | 8.1 | 7 | 0.794 | 800 | 4600 | 1200 × 1 | 4.2 | 12.5 | 19.8 | 7.3 | >1 × $10^9$ | 13.4 |

TABLE 4

| IG | [N] ($10^{11}$ atoms/$cm^3$) | [Oi] ($10^{17}$ atoms/$cm^3$) | Cooling Rate (° C./min) | OPP strength (V) | Calculated void volume ($nm^3$) | OPP calculated void volume ($nm^3$) | Annealing conditions (° C. × hr) | [Oi] at 1 μm depth ($10^{16}$ atoms/$cm^3$) | COP DZ (μm) | Oi DZ (μm) | Oi DZ-COP DZ (μm) | BMD density ($10^8$ pieces/$cm^3$) | Nitrogen Spike depth (μm) |
|---|---|---|---|---|---|---|---|---|---|---|---|---|---|
| G | 0 | 9.5 | 11 | 2.51 | 274000 | 511000 | 1150 × 4 | 3.5 | 3 | 17.3 | 14.3 | >1 × $10^9$ | None |
| G | 0 | 8.5 | 11 | 2.51 | 274000 | 511000 | 1150 × 4 | 3.2 | 3 | 17.3 | 14.3 | 4 × $10^9$ | None |
| G | 0 | 9.1 | 11 | 2.51 | 274000 | 511000 | 1200 × 1 | 4.8 | 5 | 17.3 | 12.3 | 8 × $10^9$ | None |
| H | 0 | 9.5 | 7 | 3.16 | 524000 | 658000 | 1150 × 4 | 3.5 | 3 | 17.3 | 14.3 | 9 × $10^9$ | None |
| H | 0 | 8.5 | 7 | 3.16 | 524000 | 658000 | 1150 × 4 | 3.2 | 3 | 17.3 | 14.3 | 5 × $10^9$ | None |
| H | 0 | 8.8 | 7 | 3.16 | 524000 | 658000 | 1200 × 1 | 4.6 | 5 | 17.3 | 12.3 | 3 × $10^9$ | None |
| I | 1.1 | 8.6 | 11 | 1.26 | 190000 | 239000 | 1150 × 4 | 3.2 | 5 | 17.3 | 12.3 | >1 × $10^9$ | 7 |
| I | 1.5 | 8.4 | 11 | 0.63 | 167000 | 112000 | 1150 × 4 | 3.2 | 5 | 17.3 | 12.3 | >1 × $10^9$ | 7 |
| J | 1.1 | 8.5 | 7 | 1.585 | 330000 | 308000 | 1150 × 4 | 3.2 | 5 | 17.3 | 12.3 | >1 × $10^9$ | 7 |
| J | 1.5 | 8.5 | 7 | 0.794 | 280000 | 239000 | 1150 × 4 | 3.2 | 5 | 17.3 | 12.3 | >1 × $10^9$ | 7 |

TABLE 5

| IG | [N] ($10^{11}$ atoms/$cm^3$) | [Oi] ($10^{17}$ atoms/$cm^3$) | Cooling Rate (° C./min) | OPP strength (V) | Calculated void volume ($nm^3$) | OPP calculated void volume ($nm^3$) | Annealing conditions (° C. × hr) | [Oi] at 1 mm depth ($10^{16}$ atoms/$cm^3$) | COP DZ (mm) | Oi DZ (mm) | Oi DZ-COP DZ (mm) | BMD density ($10^8$ pieces/$cm^3$) | Nitrogen Spike depth (mm) |
|---|---|---|---|---|---|---|---|---|---|---|---|---|---|
| K | 12 | 8.3 | 4.5 | 1.259 | 29000 | 29000 | 1200 × 1 | 4.3 | 8 | 17.3 | 9.3 | >1 × $10^9$ | 13.4 |
| K | 26 | 7.9 | 4.5 | 1.585 | 240 | 560 | 1200 × 1 | 4.2 | 8 | 17.3 | 9.3 | >1 × $10^9$ | 13.4 |
| K | 36 | 7.6 | 4.5 | 1.259 | 10 | 250 | 1200 × 1 | 4.0 | 8 | 17.3 | 9.3 | >1 × $10^9$ | 13.4 |
| K | 26 | 7.9 | 4.5 | 1.585 | 240 | 560 | 1200 × 0 | 5.9 | 4 | 17.3 | 7.3 | >1 × $10^9$ | 5 |
| L | 12 | 7.9 | 2.5 | 6.31 | 115000 | 8300 | 1200 × 1 | 4.1 | 8 | 17.3 | 9.3 | >1 × $10^9$ | 13.4 |
| L | 26 | 7.4 | 2.5 | 6.31 | 950 | 1300 | 1200 × 1 | 3.9 | 8 | 17.3 | 9.3 | >1 × $10^9$ | 13.4 |
| L | 36 | 7.1 | 2.5 | 1.585 | 50 | 600 | 1200 × 1 | 3.8 | 8 | 17.3 | 9.3 | >1 × $10^9$ | 13.4 |
| L | 26 | 7.4 | 2.5 | 6.31 | 1300 | 1300 | 1200 × 0 | 5.5 | 4 | 17.3 | 7.3 | >1 × $10^9$ | 5 |

TABLE 6

| IG | [N] ($10^{11}$ atoms/$cm^3$) | [Oi] ($10^{17}$ atoms/$cm^3$) | Cooling Rate (° C./min) | OPP strength (V) | Calculated void volume ($nm^3$) | OPP calculated void volume ($nm^3$) | Annealing conditions (° C. × hr) | [Oi] at 1 mm depth ($10^{16}$ atoms/$cm^3$) | COP DZ (mm) | Oi DZ (mm) | Oi DZ-COP DZ (mm) | BMD density ($10^8$ pieces/$cm^3$) | Nitrogen Spike depth (mm) |
|---|---|---|---|---|---|---|---|---|---|---|---|---|---|
| M | 0 | 9.5 | 4.5 | 7.94 | 990000 | 1040000 | 1200 × 1 | 5.0 | 3 | 17.3 | 14.3 | 5 × $10^8$ | None |
| M | 0 | 8.6 | 4.5 | 7.94 | 990000 | 1040000 | 1200 × 1 | 4.6 | 3 | 17.3 | 14.3 | 3 × $10^8$ | None |
| N | 0 | 9.4 | 2.5 | 12.6 | 2310000 | 1720000 | 1200 × 1 | 4.9 | 3 | 17.3 | 14.3 | 3 × $10^8$ | None |
| N | 0 | 8.6 | 2.5 | 12.6 | 2310000 | 1720000 | 1200 × 1 | 4.5 | 3 | 17.3 | 14.3 | 1 × $10^8$ | None |
| O | 4.6 | 8.0 | 4.5 | 3.98 | 227000 | 177000 | 1200 × 1 | 4.2 | 5 | 17.3 | 12.3 | 8 × $10^8$ | 13.4 |
| O | 8.9 | 7.6 | 4.5 | 1.995 | 47000 | 59000 | 1200 × 1 | 4.0 | 5 | 17.3 | 12.3 | 4 × $10^8$ | 13.4 |
| P | 4.6 | 8.0 | 2.5 | 6.31 | 580000 | 371000 | 1200 × 1 | 4.2 | 5 | 17.3 | 12.3 | 6 × $10^8$ | 13.4 |
| P | 8.9 | 7.6 | 2.5 | 3.98 | 138000 | 177000 | 1200 × 1 | 4.0 | 5 | 17.3 | 12.3 | 2 × $10^8$ | 13.4 |

Here, the data of Table 2 and Table 3 concern examples of the product of this invention having a diameter of 6 inches. These examples pertain to silicon semiconductor substrates satisfying the parameters of the present invention. That is, these silicon semiconductor substrates satisfy the condition that the cooling speed be not less than 5° C./min and the nitrogen concentration be not less than $5\times10^{14}$ atoms/cm$^3$, the heat treatment be carried out in a non-oxidizing atmosphere at a temperature of not less than 1150° C. for a duration of not less than one hour, and the oxygen concentration at a depth of 1 μm from the surface layer after the heat treatment be not more than $7\times10^{17}$ atoms/cm$^3$ as measured by SIMS.

The annealing conditions of 1200° C.×0 hour used in the present example satisfy the requirement of this invention for production that the temperature be not less than 1150° C. and the duration be not less than one hour because the durations for increasing and decreasing temperature between 1150° C. and 1200° C. total 100 minutes (for the temperature increasing and decreasing rates in this temperature range is 1° C.)

The calculated void volume shown in the tables is the maximum void volume of a given silicon semiconductor substrate prior to the heat treatment that is calculated from the cooling speed and the nitrogen concentration shown in the relevant working example in accordance with the calculation formula forming the left part of the expression (2). The OPP calculated void volume shown in the tables is the numerical value calculated in accordance with the expressions (4) through (6) using the maximum signal strength obtained by the OPP measurement. The void volume, similar to the maximum void volume which is calculated by the calculation formula forming the left part of the expression (2) mentioned above (the calculated void volume shown in the tables), satisfies the maximum allowable void volume of not more than 100000 nm$^3$ indicated by the left part of the expression (2). This fact confirms that the silicon semiconductor substrate prior to the heat treatment obtained in accordance with the evaluation by OPP falls in the scope defined by this invention. Incidentally, the maximum signal strength calculated from the OPP measurement is obtainable only as a digitised value of measurement on the device used for the measurement. Thus, the void volume calculated from the OPP maximum signal strength does not completely coincide with the void volume found from the expression of (2).

The data of Table 4 concerns the products of the comparative examples which do not satisfy the requirement for the silicon semiconductor substrate of this invention having a diameter of 6 inches. Since mainly the nitrogen concentrations of these products deviate from the scope of this invention in terms of the requirement for production, the relation of (Oi DZ)−(COP DZ)≦10 μm is not satisfied because the oxygen precipitate crystal defects of the invention do not always satisfy the condition that the number of such defects be not more than $5\times10^8$ pieces/cm$^3$.

Further, the data of Table 5 concerns products of the examples of this invention having a diameter of 8 inches and these products are silicon semiconductor substrates. That is, the conditions that the cooling speed be not less than 1° C./min and less than 5° C./min, that the nitrogen concentration in the silicon semiconductor substrate prior to the heat treatment be not less than $1\times10^{15}$ atoms/cm$^3$, that the heat treatment be carried out in a non-oxidizing atmosphere at a temperature of not less than 1200° C. for a duration of not less than one hour, and that the oxygen concentration at a depth of 1 μm from the surface layer subsequent to the heat treatment be not more than $7\times10^{17}$ atoms/cm$^3$ in the measurement by the SIMS are satisfied.

The calculated void volumes shown in Table 5 are the maximum void volumes of the silicon semiconductor substrates prior to the heat treatment which are found from the calculation formula forming the left part of the expression (3) using the cooling speeds and the nitrogen concentrations shown in the relevant examples. Then, the OPP calculated void volumes shown in the table are the numerical values found by substituting the maximum signal strengths obtained by the OPP measurement in the relational expressions (4) through (6). Thus, the calculated void volumes and the OPP calculated void volumes mentioned above do not exceed the maximum allowable void volume of 150000 nm$^3$ shown in the left part of the expression of (3).

The data of Table 6 concern the products of the comparative examples which do not satisfy the conditions for the silicon semiconductor substrate mainly having a diameter of 8 inches according to the invention. Since mainly the nitrogen concentrations of these products deviate from the ranges of the conditions for production, these products do not satisfy the relation (1) for the requirement that the number of the oxygen precipitate crystal defects be not less than $5\times10^8$ pieces/cm$^3$.

As described above, the silicon semiconductor substrate according to this invention is enabled to control the depth of the denuded zone of both void type crystal defects and oxygen precipitates, the density of the oxygen precipitate defects, and the depth of occurrence of the defects so as to acquire a structure which possesses oxygen precipitate defects fated to form gettering sites in a high density just below the denuded zone of void type defects. This technique can be achieved by controlling the nitrogen concentration in the silicon semiconductor substrate prior to the heat treatment and the cooling rate within the ranges defined by this invention.

Accordingly, while only a few embodiments of the present invention have been shown and described, it is obvious that many changes and modifications may be made thereunto without departing from the spirit and scope of the invention.

What is claimed is:

1. A silicon semiconductor substrate formed by heat-treating a silicon semiconductor substrate derived from a silicon single crystal grown by the Czochralski method or the magnetic field-applied Czochralski method, satisfying the relational expression:

(Oi DZ)−(COP DZ)≦10 μm, wherein Oi DZ denotes a thickness of a zone at a surface of the silicon semiconductor substrate which is free of oxygen precipitate crystal defects and COP DZ denotes a thickness of a zone at the surface of the silicon semiconductor substrate which is devoid of a void type defect measuring not less than 0.11 μm in size, and having not less than $5\times10^8$ oxygen precipitate crystal defects per cm$^3$.

2. A silicon semiconductor substrate according to claim 1, wherein the substrate possesses at a depth of not less than 5 μm from the surface thereof a locally concentrated part originating in a nitrogen segregation exhibiting a signal strength not less than twice as high as an average signal strength as determined in an analysis of nitrogen by a method of secondary ion mass analysis (SIMS).

3. A method for the production of a silicon semiconductor substrate derived from a silicon single crystal grown by the Czochralski method or the magnetic field-applied Czochralski method, satisfying the relational expression:

(Oi DZ)−(COP DZ)≦10 μm, wherein Oi DZ denotes a thickness of a zone at a surface of the silicon semiconductor substrate which is free of oxygen precipitate crystal defects and COP DZ denotes a thickness of a zone at a surface of the silicon semiconductor substrate which is devoid of a void type defect measuring not less than 0.11 μm in size, and having not less than $5\times10^8$ oxygen precipitate crystal defects per $cm^3$, said silicon semiconductor substrate having a nitrogen concentration in a range between $5\times10^{14}$ atoms/$cm^3$ and $1\times10^{16}$ atoms/$cm^3$, said method comprising:

heat-treating the silicon semiconductor substrate in a nonoxidizing atmosphere thereby causing the substrate to acquire an oxygen concentration of not more than $7\times10^{16}$ atoms/$cm^3$ at a depth of 1 μm from the surface at a center of the substrate and to possess a locally concentrated part originating in a nitrogen segregation exhibiting a signal strength not less than twice as high as an average signal strength as determined in an analysis of nitrogen by a method of secondary ion mass analysis (SIMS) at a depth of not less than 5 μm from the surface thereof.

4. A method for the production of a silicon semiconductor substrate derived from a silicon single crystal grown by the Czochralski method or the magnetic field-applied Czochralski method and satisfying the relational expression:

(Oi DZ)−(COP DZ)≦10 μm, wherein Oi DZ denotes a thickness of a zone at a surface of the silicon semiconductor substrate which is free of oxygen precipitate crystal defects and COP DZ denotes a thickness of a zone at the surface of the silicon semiconductor substrate which is devoid of a void type defect measuring not less than 0.11 μm in size, and having not less than $5\times10^8$ oxygen precipitate crystal defects per $cm^3$, said method comprising:

deriving the silicon semiconductor substrate using molten silicon containing not less than $5\times10^{17}$ atoms and not more than $1.5\times10^{19}$ atoms of nitrogen per $cm^3$ and heat-treating the silicon semiconductor substrate in a non-oxidizing atmosphere at a highest final temperature of not lower than 1150° for not less than one hour thereby enabling the substrate to acquire an oxygen concentration of not more than $7\times10^{16}$ atoms/$cm^3$ at a depth of 1 μm from the surface at a center of the substrate and to possess a locally concentrated part owing to a nitrogen segregation exhibiting signal strength not less than twice as high as an average signal strength as determined by an analysis of nitrogen according to a method of secondary ion mass analysis (SIMS) at a depth of not less than 5 μm from the surface thereof.

5. A method for the production of a silicon semiconductor substrate derived from a silicon single crystal grown by the Czochralski method or the magnetic field-applied Czochralski method, satisfying the relational expression:

(Oi DZ)−(COP DZ)≦10 μm, wherein Oi DZ denotes a thickness of a zone at a surface of the silicon semiconductor substrate which is free of oxygen precipitate crystal defects and COP DZ denotes a thickness of a zone at the surface of the silicon semiconductor substrate which is devoid of a void type defect measuring not less than 0.11 μm in size, and having not less than $5\times10^8$ oxygen precipitate crystal defects per $cm^3$ said method comprising:

deriving the silicon semiconductor substrate from a silicon single crystal grown from a silicon melt containing not less than $5\times10^{17}$ atoms and not more than $1.5\times10^{19}$ atoms of nitrogen per $cm^3$ and, when the growing silicon single crystal passes a temperature region of 1100° C., cooling the silicon single crystal at a rate of not less than 5° C./min, obtaining the silicon semiconductor substrate at such a cooling rate and such a nitrogen concentration as satisfy the relational expression:

$$8620000\times(CR)^{-1.4}\times EXP(-3.3\times10^{-15}\times[N])\leq100000 \text{ nm}^3$$

which indicates a maximum void volume of a void type defect where [N] (expressed in atoms/$cm^3$) represents nitrogen concentration in the silicon substrate prior to heat treatment and CR (expressed in ° C./min) represents cooling rate during passage of the growing silicon single crystal through a temperature range of 1100° C., and heat-treating the silicon semiconductor substrate in a nonoxidizing atmosphere at a highest final temperature of not lower than 1150° C. for not less than one hour.

6. A method for the production of a silicon semiconductor substrate derived from a silicon single crystal grown by the Czochralski method or the magnetic field-applied Czochralski method, satisfying the relational expression:

(Oi DZ)−(COP DZ)≦10 μm, wherein Oi DZ denotes a thickness of a zone at a surface of the silicon semiconductor substrate which is free of oxygen precipitate crystal defects and COP DZ denotes a thickness of a zone at the surface of the silicon semiconductor substrate which is devoid of a void type defect measuring not less than 0.11 μm in size, and having not less than $5\times10^8$ oxygen precipitate crystal defects per $cm^3$, said method comprising:

deriving the silicon semiconductor substrate from a silicon single crystal grown from a silicon melt containing not less than $1\times10^{18}$ atoms and not more than $1.5\times10^{19}$ atoms of nitrogen per $cm^3$ and, when the growing silicon single crystal being pulled passes a temperature region of 1100° C., cooling the silicon single crystal at a rate of not less than 1° C./min and less than 5° C./min, obtaining the silicon semiconductor substrate at such a cooling rate and such a nitrogen concentration to satisfy the relational expression:

$$8620000\times(CR)^{-1.4}\times EXP(-3.3\times10^{-15}\times[N])\leq150000 \text{ nm}^3$$

which indicates a maximum void volume of a void type defect where [N] (expressed in atoms/$cm^3$) represents nitrogen concentration in the silicon substrate prior to heat treatment and CR (expressed in ° C./min) represents cooling rate during passage of the growing silicon single crystal through a temperature range of 1100° C., and heat-treating the silicon semiconductor substrate in a nonoxidizing atmosphere at a highest final temperature of not lower than 1200° C. for not less than one hour.

* * * * *

UNITED STATES PATENT AND TRADEMARK OFFICE
CERTIFICATE OF CORRECTION

PATENT NO. : 7,208,043 B2 Page 1 of 1
APPLICATION NO. : 10/236273
DATED : April 24, 2007
INVENTOR(S) : Akiyoshi Tachikawa et al.

It is certified that error appears in the above-identified patent and that said Letters Patent is hereby corrected as shown below:

Column 15, Line 46, Claim 4:

Delete "1150" and insert -- 1150°C --.

Signed and Sealed this

Twenty-third Day of December, 2008

JON W. DUDAS
*Director of the United States Patent and Trademark Office*